United States Patent
Scofield et al.

(10) Patent No.: US 8,214,066 B1
(45) Date of Patent: Jul. 3, 2012

(54) SYSTEM AND METHOD FOR CONTROLLING NOISE IN REAL-TIME AUDIO SIGNALS

(75) Inventors: Daniel Scofield, Meridian, ID (US); Mark Peterson, Boise, ID (US)

(73) Assignee: Marvell International Ltd., Hamilton (BM)

( * ) Notice: Subject to any disclaimer, the term of this patent is extended or adjusted under 35 U.S.C. 154(b) by 653 days.

(21) Appl. No.: 12/406,465

(22) Filed: Mar. 18, 2009

Related U.S. Application Data

(60) Provisional application No. 61/039,285, filed on Mar. 25, 2008.

(51) Int. Cl.
   *G06F 17/00* (2006.01)
(52) U.S. Cl. .................................................. 700/94
(58) Field of Classification Search ............ 700/94; 704/200, 232, 233, 246, 248, 256, 265
   See application file for complete search history.

(56) References Cited

U.S. PATENT DOCUMENTS 6,321,194 B1 * 11/2001 Berestesky ................ 704/232
2002/0164013 A1 * 11/2002 Carter et al. ............ 379/387.02

* cited by examiner

*Primary Examiner* — Andrew C Flanders

(57) ABSTRACT

A system for processing a digital audio signal that includes a plurality of samples is disclosed. The system comprises a magnitude determination module, a windowing module, a summing module and a comparison module. The magnitude determination module determines a magnitude of each of the plurality of samples of the digital audio signal. The windowing module selects a subset of the plurality of samples, which are summed by the summing module to obtain a subset sum. The comparison module compares the subset sum to a threshold, and generates a silence indicating signal based on the comparison of the subset sum to the threshold. The silence indicating signal is indicative of a period of silence in the digital audio signal.

20 Claims, 8 Drawing Sheets

SYSTEM AND METHOD FOR CONTROLLING NOISE IN REAL-TIME AUDIO SIGNALS

CROSS-REFERENCE TO RELATED APPLICATIONS

This application claims the benefit of U.S. Provisional Application No. 61/039,285, filed on Mar. 25, 2008. The disclosure of the above application is incorporated herein by reference in its entirety.

FIELD

The present disclosure relates to audio signal processing and, more particularly, to a system and method of controlling noise in audio signals.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Many electronic devices, for example, telephones, answering machines, fax machines and computers, may include a mechanism for recording or playing audio. In these systems, the audio signal typically includes a desired signal component and a noise component. In some situations, the effect of the noise component can be significant and can detract from the overall audio experience. When the desired signal component of the audio signal is not present, such as during a period of silence, the device playing the audio signal will only reproduce the noise component. Thus, the noise component may be especially noticeable during such periods of relative silence.

During playback, it is generally desirable to have the noise level be as low as possible. Furthermore, the noise component may have a specific or dominant feature, such as a constant tone at a given frequency, which may be particularly bothersome to a user listening to the playback of the audio signal.

Electronic systems are generally designed to control or eliminate noise. It is sometimes necessary, however, to control noise during playback after a system has captured noise during the recording process, e.g., leaving a message on an answering machine while in a noisy environment. Furthermore, fully designed systems may be susceptible to the effects of noise at specific frequencies because of other design considerations, which makes it impractical to control or eliminate noise at the design stage.

SUMMARY

In various embodiments, the present disclosure is directed to a system for processing a digital audio signal including a plurality of samples. The system comprises a magnitude determination module, a windowing module, a summing module and a comparison module. The magnitude determination module determines a magnitude of each of the plurality of samples of the digital audio signal. The windowing module selects a subset of the plurality of samples, which are summed by the summing module to obtain a subset sum. The comparison module compares the subset sum to a threshold, and generates a silence indicating signal based on the comparison of the subset sum to the threshold. The silence indicating signal is indicative of a period of silence in the digital audio signal.

In still other features, the systems and methods described above are implemented by a computer program executed by one or more processors. The computer program can reside on a computer readable medium such as but not limited to memory, nonvolatile data storage, and/or other suitable tangible storage mediums.

Further areas of applicability of the present disclosure will become apparent from the detailed description, the claims and the drawings. The detailed description and specific examples are intended for purposes of illustration only and are not intended to limit the scope of the disclosure.

DESCRIPTION

Figure 1:
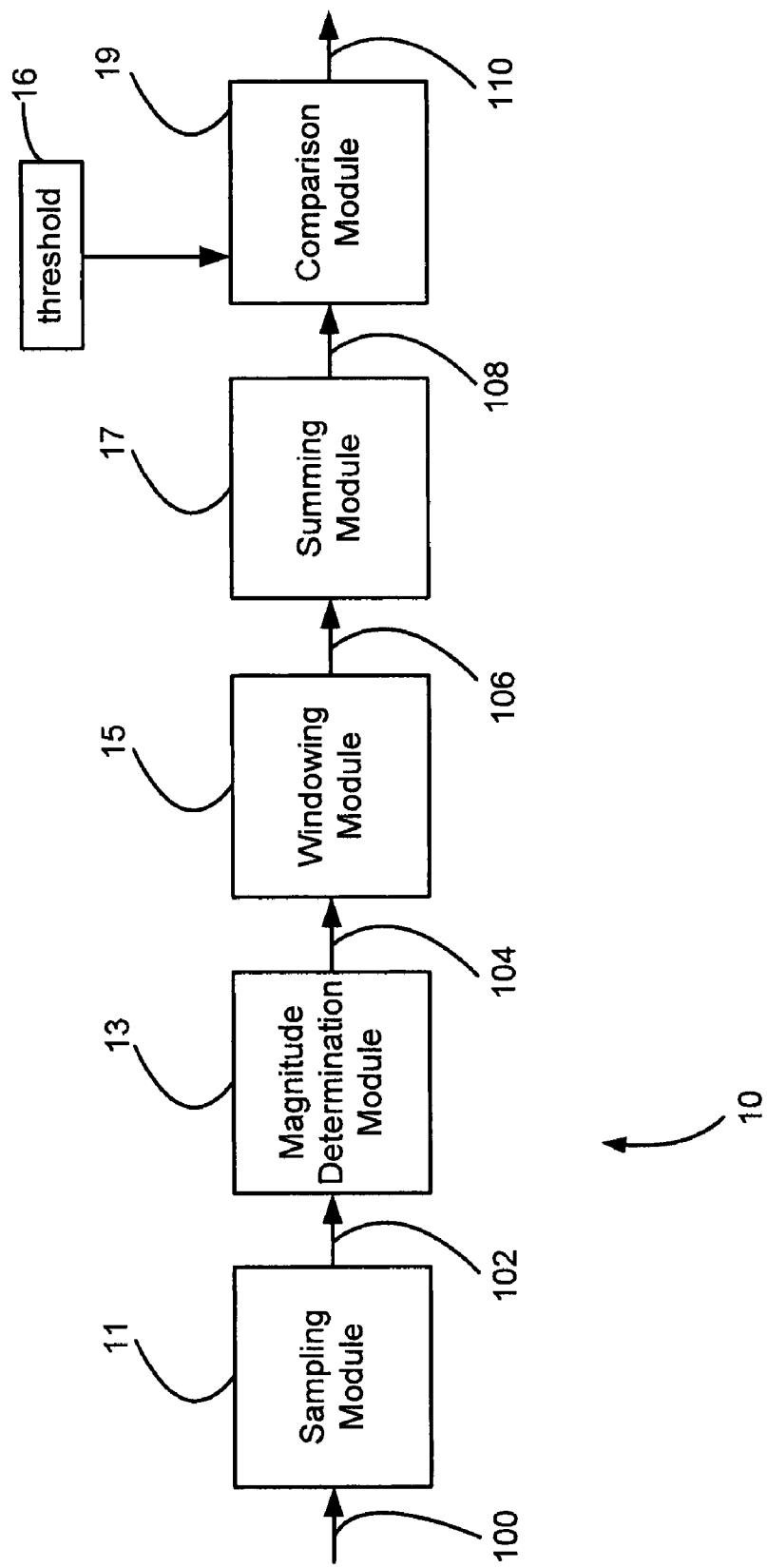
FIG. 1 is a functional block diagram of a system for controlling a noise component of an audio signal.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable hardware components that provide the described functionality.

Figure 2:
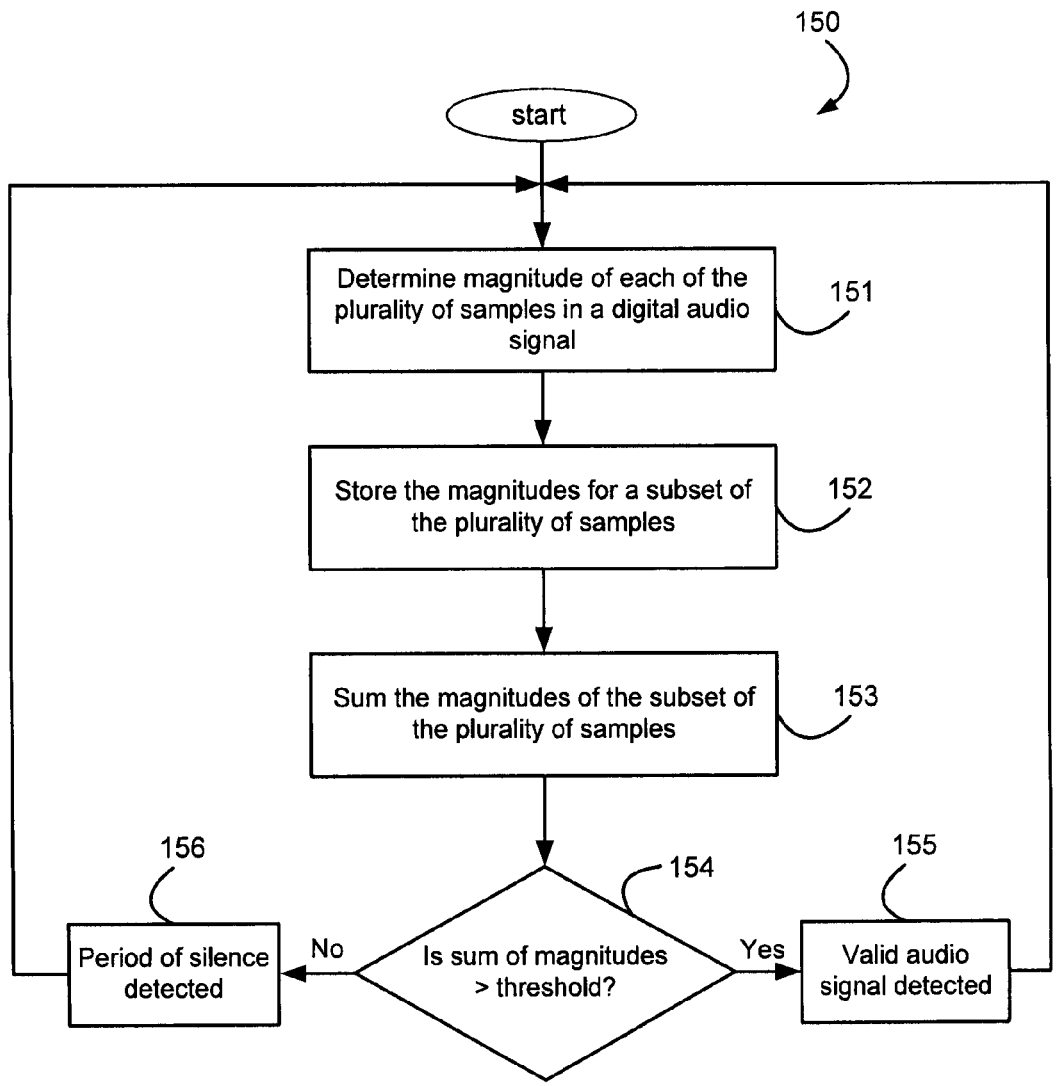
FIG. 2 is an exemplary flowchart of a method for controlling a noise component of an audio signal.

FIGS. 1 and 2 illustrate, respectively, a system and method of detecting periods of relative silence in an audio signal according to various embodiments of the present disclosure. A silence detection system 10 comprises a sampling module 11, a magnitude determination module 13, a windowing module 15, a summing module 17 and comparison module 19, which receives a threshold 16 as an input. An analog audio signal 100, which includes a desired signal component and a noise component, is first sampled by sampling module 11.

Figure 3:
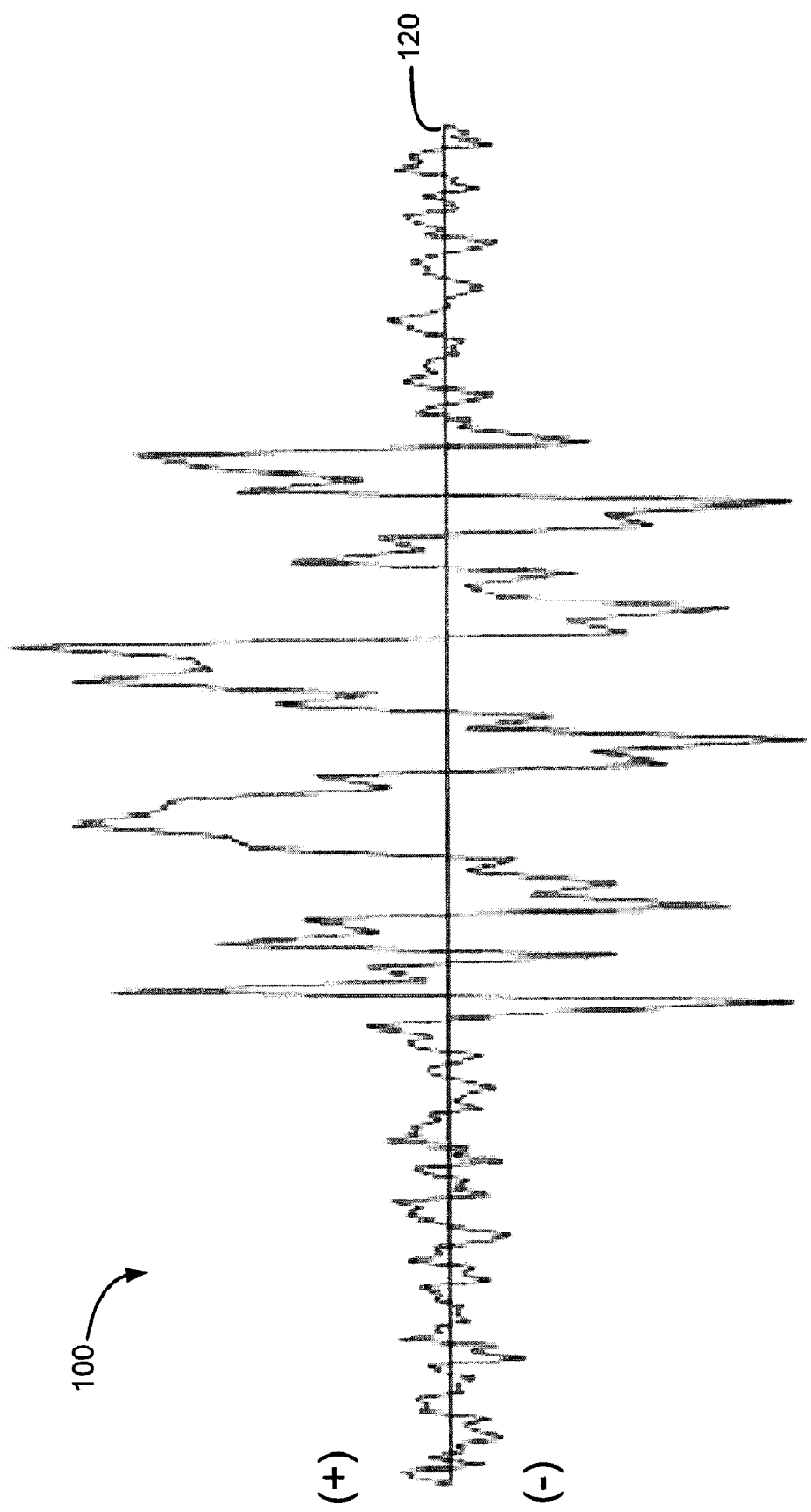
FIG. 3 is a graphical representation of an exemplary audio signal.

An exemplary analog audio signal 100 is illustrated in FIG. 3. Sampling module 11 samples and digitizes analog audio signal 100 to obtain a digital audio signal 102. Sampling module 11 may comprise an analog-to-digital converter ("ADC") or similar electronic circuit. Digital audio signal 102 comprises a plurality of samples of the analog audio signal 100 when the analog audio signal 100 is sampled at a given frequency. The samples generally oscillate around a center magnitude point or center point that is coincident with a zero magnitude point or a zero point 120. As discussed more fully below, the center point of the samples may deviate from the zero point 120 by an offset. The samples have a magnitude that is either a positive or a negative value.

In the silence detection system 10, an analog audio signal 100 is processed by sampling module 11. Sampling module 11 samples and digitizes analog audio signal 100 to obtain a digital audio signal 102. Digital audio signal 102 comprises a plurality of samples of the analog audio signal 100 that represent the value of the analog audio signal 100 sampled at a given frequency. If, instead of an analog audio signal, a digital audio signal was to be processed, sampling module 11 could be bypassed or removed from the silence detection system 10.

Digital audio signal 102 is processed by a magnitude determination module 13. The magnitude determination module 13 determines a magnitude for each of the samples of digital audio signal 102, e.g., by determining the absolute value of the magnitude for each of the samples of digital audio signal 102. Thus, the output 104 of magnitude determination module 13 will comprise a modified version of digital audio signal 102 in which all of the samples are given a positive amplitude value. For illustration only, a digital audio signal 102 having a magnitude value for a plurality of samples equal to (2, −6, 4, 8, −2) will be transformed by magnitude determination module 13 such that output 104 is equivalent to (2, +6, 4, 8, +2).

Other methods of determining the magnitude of each sample of the digital audio signal 102 may be utilized, such as squaring the sample and taking the square root. Additionally, the sampled magnitude values may be modified, such as by each sample being multiplied by the same number, without affecting operation of the system. Furthermore, instead of determining the positive value of each of the magnitudes as described above, a negative value for each of the magnitudes may be determined and utilized, as described below, with the threshold 16 comprising a negative number.

The output 104 from magnitude determination module 13 is received at windowing module 15. Windowing module 15 stores a subset of magnitude values from the output 104. For illustration only, windowing module 15 may comprise a first-in first-out ("FIFO") buffer having a limited storage space, although other types of memory or electronic circuits may be used for the storage process. Windowing module 15 creates a subset of past magnitudes of the output 104 that are utilized by summing module 17, as described below.

During periods of relative silence in the analog audio signal 100, the digital audio signal 102 will include relatively small magnitude samples above or below the zero point 120. The deviation from zero in a period of silence may comprise the noise component of analog audio signal 100. The term "silence" or "relative silence" is used throughout this disclosure to correspond to a period of time during which the magnitudes of samples of an audio signal are relatively small and, thus, it can be assumed that there is no desired signal component in the audio signal and the small magnitude of the samples comprise noise. Even in portions of the digital audio signal 102 in which a desired signal component is present, samples that have a relatively small or zero magnitude may occur frequently even during very high magnitude, e.g., loud, portions of the desired signal component of analog audio signal 100. Therefore, the assumption that one or even a small number of samples that have a magnitude of relatively low value indicates a period of silence may be erroneous. If there is a sustained period of time in which all or nearly all of the samples have a low magnitude, however, it may be assumed that the digital audio signal 102 is in a period of relative silence. Thus, windowing module 15 is utilized to store a plurality of samples of signal 104 such that a sustained period of low magnitude values may be determined.

Summing module 17 receives the subset of magnitude values 106 output by windowing module 15. Summing module 17 sums the subset of magnitudes to determine a subset sum 108. In a situation in which magnitude determination module 13 did not determine the absolute value of the magnitudes, the positive and negative magnitudes of digital audio signal 102 would cancel each other out and, thus, provide very little information to be utilized. The subset sum 108 output from summing module 17 is utilized by comparison module 19 to determine periods of relative silence in the digital audio signal 102.

Comparison module 19 compares the subset sum 108 with a threshold 16. The threshold 16 is set such that a subset sum 108 larger than the threshold 16 may be assumed to be desired signal component of digital audio signal 102. In a situation in which the subset sum 108 is less than the threshold 16, comparison module 19 will determine that the digital audio signal 102 is in a period of relative silence. Comparison module 19 outputs a silence indicating signal 110 that is indicative of whether a valid audio signal or a period of silence is present in the digital audio signal 102.

FIG. 2 illustrates a method 150 for controlling noise in an audio signal according to various embodiments of the present disclosure. At step 151, the magnitude of each of the samples of digital audio signal 102 is determined, and a subset of these magnitudes is stored at step 152. The magnitudes within the subset are summed at step 153, which is then compared to a threshold at step 154. The threshold is set such that if the sum of the magnitudes within the subset—i.e., the subset sum—is larger than the threshold, the method determines that a valid audio signal is detected at step 155. If the subset sum is less than the threshold, the method proceeds to step 156 at which the method determines that a period of relative silence is detected. In either case, the method 150 returns to step 151 and repeats with the next sample in digital audio signal 102.

Figure 4:
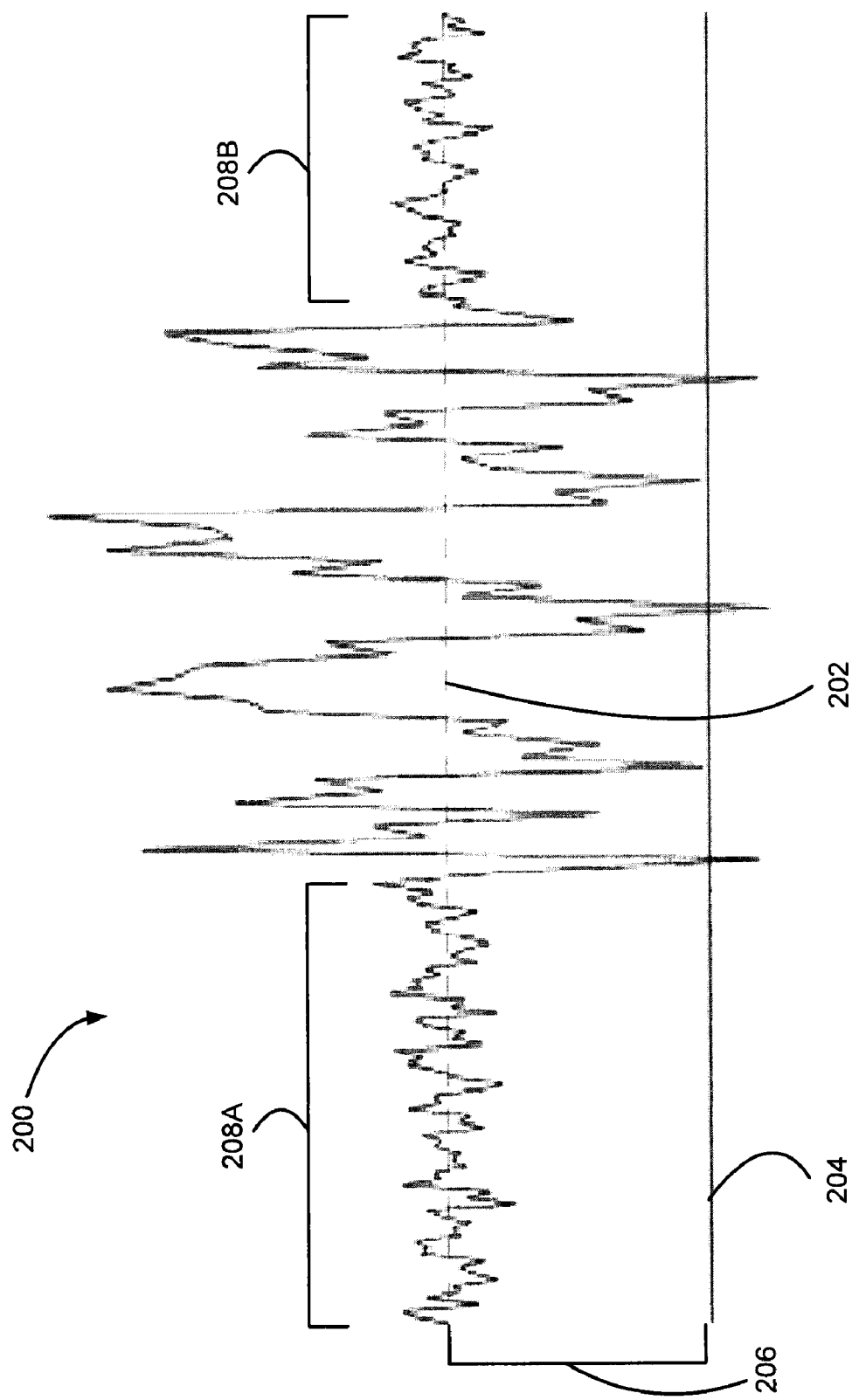
FIG. 4 is a graphical representation of an exemplary audio signal that has a center point offset from a value of zero magnitude.

Ideally, an audio signal will oscillate around a center point that has a value of zero, as shown in FIG. 3. It is not uncommon, however, for the center point of an audio signal to be offset from the zero value, e.g., due to effects from the specific hardware of the audio system. Further, identical systems may have different offsets due to tolerances that allow for variances in individual parts of the system, and the center point may even move through the life of the system. An exemplary analog audio signal 200 with a center point 202 that differs from the zero point 204 is illustrated in FIG. 4. The center point 202 of analog audio signal 200 differs from the zero point 204 by offset 206. If the analog audio signal 200 is processed by the silence detection system 10 of FIG. 1, it is possible that even periods of relative silence 208A, 208B may be detected as valid audio content due to the large magnitude value of the offset. Therefore, the silence detection system 10 may be made more reliable by compensating for the deviation of the center point of the audio signal from the zero point.

Figure 5:
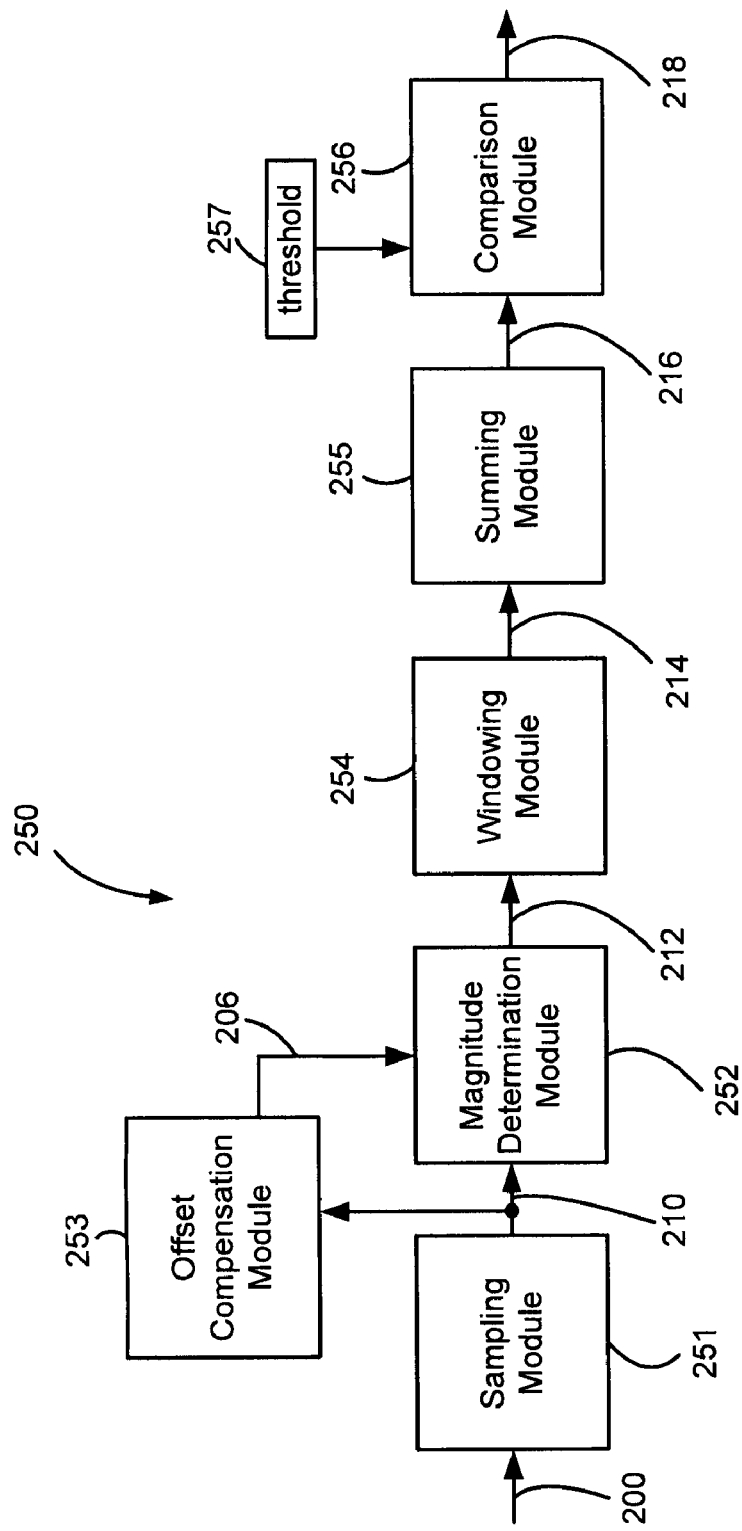
FIG. 5 is a functional block diagram of a system for controlling a noise component of an audio signal including an offset compensation module.

An exemplary silence detection system 250 that compensates for center point offset from zero in an audio signal is illustrated in FIG. 5. Analog audio signal 200 is received by sampling module 251, which operates similarly to sampling module 11 discussed above. Digital audio signal 210 is output from sampling module 251 and is received by magnitude determination module 252 and offset compensation module 253. Offset compensation module 253 detects the offset 206. The offset 206 is output to magnitude determination module 252. The magnitude determination module 252 determines the absolute value of the magnitude—as measured from the offset center point 202—for each of the samples of digital audio signal 210. Thus, the output 212 of magnitude determination module 252 will comprise a modified version of digital audio signal 210 in which all of the samples are given a positive amplitude value as measured from the offset center point 202.

The output signal 212 from magnitude determination module 252 is received at windowing module 254, which stores a subset of magnitude values from output signal 212. Windowing module 254 creates a subset 214 of magnitudes of output signal 212 that are utilized by summing module 255. Summing module 255 receives the subset 214 of magnitude values output by windowing module 254. Summing module 255 sums the subset of magnitudes to determine a subset sum 216. Subset sum 216 is output from summing module 255 and utilized by comparison module 256 to determine periods of relative silence in the digital audio signal 210. Comparison module 19 compares the subset sum 216 with a threshold 257. As is discussed above, the threshold 257 is set such that a subset sum 216 larger than the threshold 257 may be assumed to desired signal component of digital audio signal 210. In a situation in which the subset sum 216 is less than the threshold 257, comparison module 256 will determine that the digital audio signal 210 is in a period of relative silence. Comparison module 256 outputs a signal 218 that is indicative of whether a valid audio signal or a period of silence is present in the digital audio signal 210.

Offset compensation module 253 may determine the center point 202 and offset 206 of analog audio signal 200 in a number of ways. For example, the center point 202 of analog audio signal 200 may be assumed to be the average of all samples of digital audio signal 210 output by sampling module 251. In this example, an exponential weighted moving average may be used to estimate the center point 202 of analog audio signal 200, such as one given by the equation:

$$\text{Centerpoint}(t) = \alpha * \text{sample}(t) + (1-\alpha) * \text{Centerpoint}(t-1),$$

where Centerpoint (t) is the value of the center point 202 at time t; sample (t) is the value of the analog audio signal 200 at time t; and $\alpha$ is a number between 0 and 1. With a weighted moving average, the center point 202 may be accurately detected even in the event that the center point 202 moves through the life of the system. Furthermore, a weighted moving average allows for a calculation of the center point 202 by processing only the current sample of the analog audio signal 200. By means of example only, a could be chosen to have a value of $\frac{1}{16}$, or another value that is a fractional power of two in order to eliminate the need for divide operations, which are computationally intensive.

Rather than compensating for the offset center point 202 at the magnitude determination module 252, the offset 206 may be utilized to adjust the threshold 257. The threshold 257 may be adjusted such that, the larger the offset 206, the greater the threshold 257 to be utilized by comparison module 256.

Figure 6:
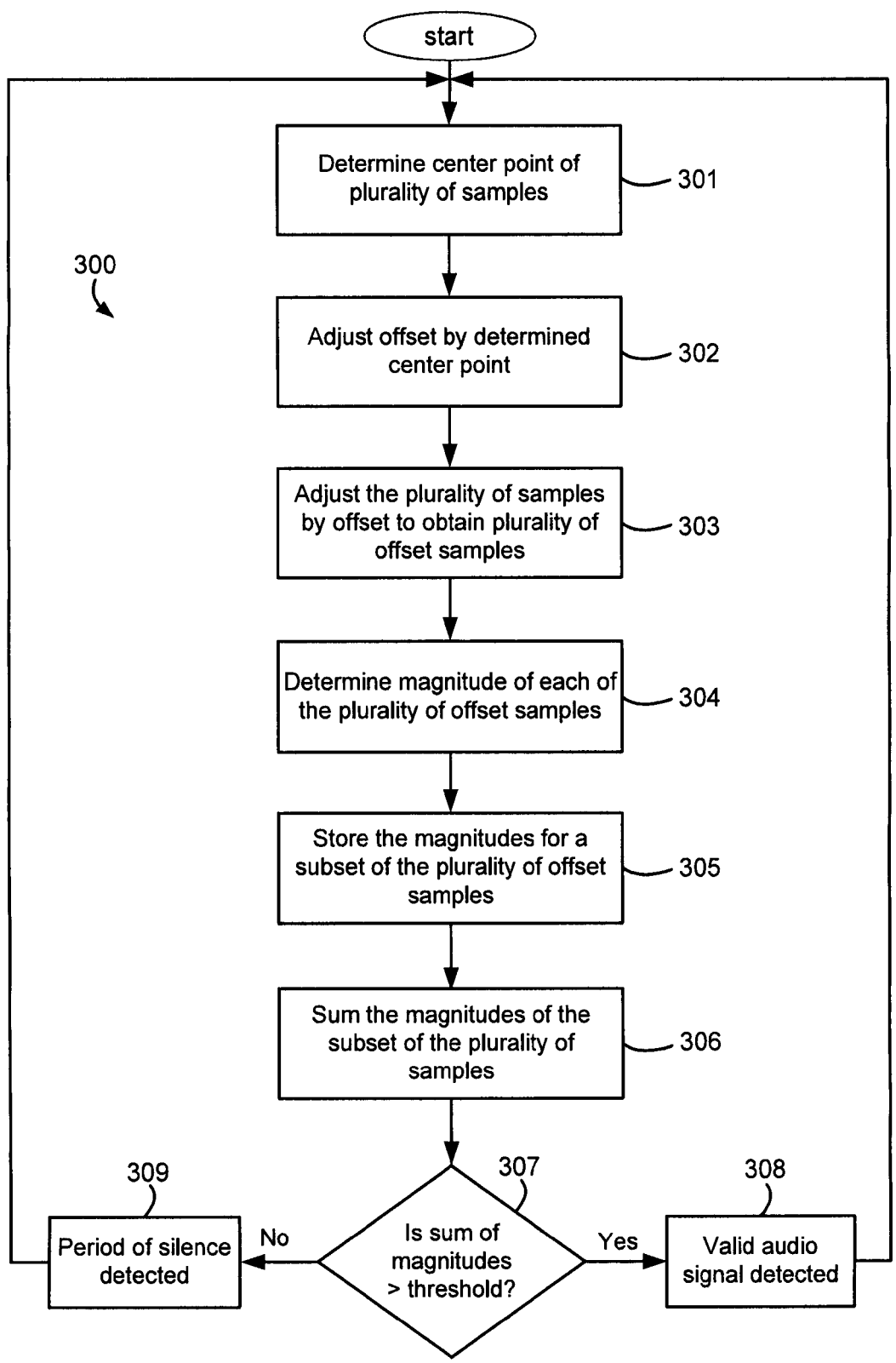
FIG. 6 is an exemplary flowchart of a method for controlling a noise component of an audio signal that compensates for center point offset.

FIG. 6 illustrates a flow chart describing an exemplary method 300 of detecting periods of relative silence in an audio signal that has a center point that is offset from a zero point according to various embodiments of the present disclosure. At step 301, the center point 202 of analog audio signal 200 is determined, e.g., by exponential weighted moving average, as described above. The offset 206 is then determined by center point 202, which is utilized to adjust the plurality of samples to obtain a plurality of offset samples at steps 302 and 303, respectively. At step 304, the magnitude of each of the plurality of offset samples is determined, and a subset of these magnitudes is stored at step 305. The magnitudes within the subset are summed at step 306, which is then compared to a threshold at step 307. The threshold is set such that if the sum of the magnitudes within the subset is larger than the threshold, the method determines that a valid audio signal is detected at step 308. If the sum of the magnitudes within the subset is less than the threshold, the method proceeds to step 309 at which the method determines that a period of relative silence is detected. In either case, the method 300 returns to step 301 and repeats with the next sample in digital audio signal 210.

Figure 7:
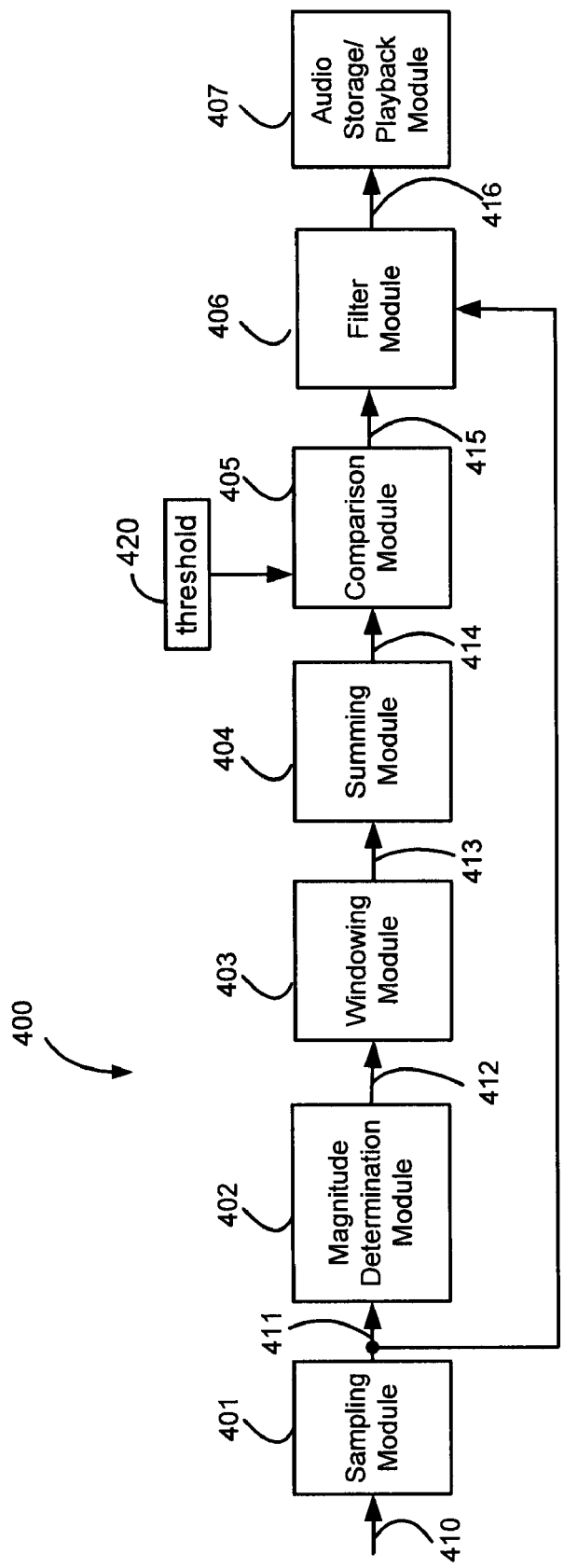
FIG. 7 is a functional block diagram of a system for controlling noise in an audio signal including a filter module and audio storage/playback module.

FIG. 7 illustrates a system for controlling noise in an audio signal according to various embodiments of the present disclosure. The system 400 comprises a sampling module 401, magnitude determination module 402, windowing module 403, summing module 404, comparison module 405, filter module 406, and audio storage/playback module 407. In the illustrated system 400, an analog audio signal 410 is processed by sampling module 401. Sampling module 401 samples and digitizes analog audio signal 410 to obtain a digital audio signal 411. Digital audio signal 411 comprises a plurality of samples of the analog audio signal 410 that represent the value of the analog audio signal 410 sampled at a given frequency. If, instead of an analog audio signal, a digital audio signal was to be processed, sampling module 401 could be bypassed or removed from the system 400.

Digital audio signal 411 is processed by a magnitude determination module 402. Magnitude determination module 402 determines the absolute value of the magnitude for each of the samples of digital audio signal 411. Thus, the output 412 of magnitude determination module 402 will comprise a modified version of digital audio signal 411 in which all of the samples are given a positive amplitude value. Magnitude determination module 402 optionally may receive an input from, or include the functionality of, offset compensation module 253 to compensate for audio signals 410 in which the center point differs from a zero value, as discussed more fully above.

The output 412 from magnitude determination module 402 is received at windowing module 403. Windowing module 403 stores a subset of magnitude values from signal 412. Windowing module 403 creates a subset of past magnitudes of signal 412 that are utilized by summing module 404. Summing module 404 sums the subset of magnitudes and determines a subset sum 414. Output 414 of summing module 404 is utilized by comparison module 405 to determine periods of relative silence in the analog audio signal 410.

Comparison module 405 compares the subset sum 414 with a threshold 420. As discussed above, the threshold 420 is set such that a subset sum 414 larger than the threshold 420 may be assumed to be the desired signal component of digital audio signal 411, and a subset sum 414 less than the threshold 420 may be assumed to be a period of relative silence. Comparison module 405 outputs a signal 415 that is indicative of whether a valid audio signal or a period of silence is present in the digital audio signal 411. A filter module 406 receives signal 415 indicative of whether a valid audio signal or period of silence is present in the digital audio signal 411, as well as digital audio signal 411. Filter module 406, based on signal 415, either passes on digital audio signal 411, if valid audio is detected, or modifies digital audio signal 411 to filter the noise, if a period of relative silence is detected, to an audio storage/playback module 407, as described more fully below.

Filter module 406 operates to reduce the effect of noise in digital audio signal 411. As discussed above, in a period of relative silence noise will be the dominant content in digital audio signal 411. In a period of relative silence, therefore, filter module 406 may process the digital audio signal 411 with little concern for eliminating valid audio content. In some embodiments, filter module 406 will attenuate the digital audio signal 411 in detected periods of relative silence. For example only, filter module 406 may reduce the magnitude of samples in digital audio signal 411 by multiplying the samples by a number between 0 and 1. In this manner, the volume of noise may be reduced without altering the overall characteristics of digital audio signal 411.

Filter module 406 may also replace the samples of digital audio signal 411 with in order to produce a signature similar to Gaussian white noise. This replacement method will eliminate particular features, e.g., a dominant frequency that produces an audible tone, in the digital audio signal 411. In a period of relative silence, filter module 406 may replace at least one of the samples of digital audio signal 411 with a substitute sample chosen randomly or pseudo-randomly from a plurality of substitute samples stored in a simple look-up table, or similar element. In either case, filter module 406 will output a signal 416 comprising digital audio signal 411 during periods of valid audio content and a version of digital audio signal 411 as modified by filter module 406 during periods of relative silence to audio storage/playback module 407.

In addition to, or as an alternative to, the attenuation and replacement methods discussed above, filter module 406 may operate as a specific signal processing filter. For example only, filter module 406 may filter digital audio signal 411 in order to eliminate particular tones or features. This filtering by filter 406 may be applied irrespective of whether a period of silence has been detected. In various embodiments, the filter module 406 may also apply a different filter depending on whether a valid audio signal or a period of relative silence has been detected.

Figure 8:
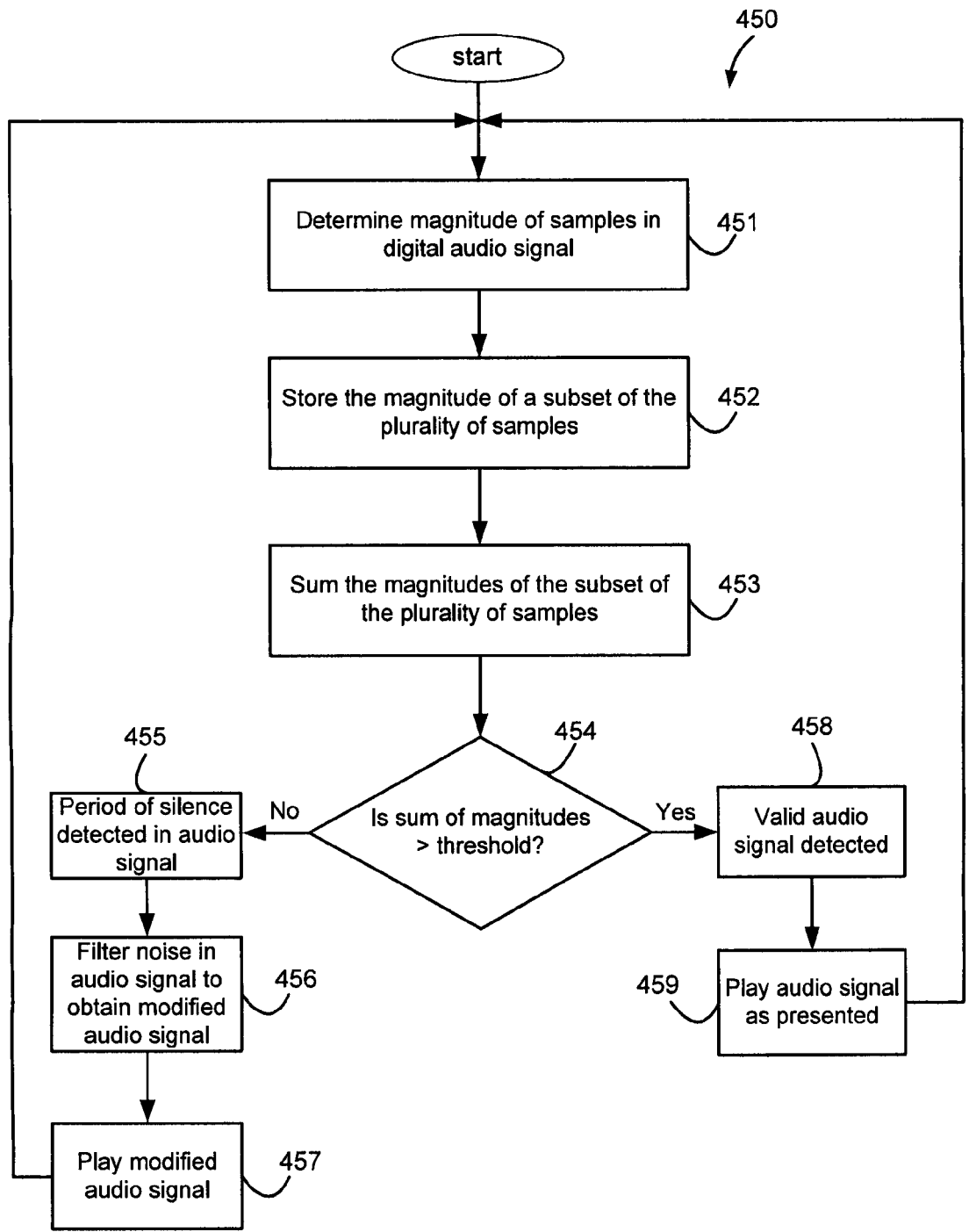
FIG. 8 is an exemplary flowchart of a method for controlling noise in an audio signal that filters the audio signal during periods of relative silence.

FIG. 8 illustrates a method 450 for controlling noise in an audio signal according to various embodiments of the present disclosure. At step 451, the magnitude of each of the samples of digital audio signal 411 is determined, and a subset of these magnitudes is stored at step 452. The magnitudes within the subset are summed at step 453, which is then compared to a threshold at step 454. If the sum of the magnitudes within the subset is less than the threshold, the method proceeds to step 455 at which the method determines that a period of relative silence is detected. The digital audio signal 411 is then filtered, as described above, to obtain a modified audio signal at step 456. At step 457, the modified audio signal is played or stored, e.g., by audio storage/playback module 407. If the sum of the magnitudes within the subset is larger than the threshold, the method determines that a valid audio signal is detected at step 458. At step 459, the unmodified digital audio signal 411 is played or stored, e.g., by audio storage/playback module 407. In either case, the method 450 returns to step 451 and repeats with the next sample in digital audio signal 411.

As discussed above, a windowing module, such as windowing modules 15, 254, or 403, is utilized to store a plurality of samples from an audio signal such that a sustained period of low or high magnitude values may be determined. Due to this windowing, however, at the transition point between silence and valid audio content, there will be a time period in which there are enough low magnitude values to dominate the subset of samples. To ensure that portions of the valid audio content will not be lost, the playback point of the audio signal may be delayed. In one implementation, the time at which a relative period of silence or valid audio content is detected may be linked, e.g., by filter module 406, to a past sample of digital audio signal.

Additionally, it may be desirable to prevent the system from detecting a period of silence until a short time after the audio signal falls below the threshold. This will prevent the system from modifying the audio signal when very short periods of silence are detected, which are common in speech where natural pauses occur, even within words. Filter module 406 may include a counter, timer or similar mechanism that will only modify the digital audio signal in the event the period of silence exceeds a certain duration or number of samples of the audio signal.

The broad teachings of the disclosure can be implemented in a variety of forms. For example, one or more steps of methods described above may be performed in a different order and still achieve desirable results. Therefore, while this disclosure includes particular examples, the true scope of the disclosure should not be so limited since other modifications may become apparent upon a study of the drawings, the specification, and the following claims.

What is claimed is:

1. A system for processing a digital audio signal including a plurality of samples, the system comprising:
    a magnitude determination module configured to determine a magnitude of each of the plurality of samples;
    a windowing module configured to select a subset of the plurality of samples;
    a summing module configured to sum the magnitude of each of the subset of the plurality of samples to obtain a subset sum; and
    a comparison module configured to
        compare the subset sum to a threshold to determine whether i) the subset of the plurality of samples corresponds to a desired signal component of the digital audio signal or ii) a period of silence is present in the digital audio signal, and
        generate a silence indicating signal, wherein the silence indicating signal is indicative of whether i) the subset of the plurality of samples corresponds to a desired signal component of the digital audio signal or ii) a period of silence is present in the digital audio signal.

2. The system of claim 1, further comprising an offset compensation module configured to compensate a center magnitude point of the digital audio signal when the center magnitude point differs from a zero magnitude point.

3. The system of claim 2, wherein the offset compensation module is configured to compensate the center magnitude point based on the equation:

$$\text{Centerpoint}(t) = \alpha * \text{sample}(t) + (1-\alpha) * \text{Centerpoint}(t-1),$$

where Centerpoint(t) is a value of the center magnitude point at time t, sample(t) is a value of the digital audio signal at time t, and a is a number between 0 and 1.

4. The system of claim 1, further comprising a filter module configured to filter the digital audio signal to reduce noise in response to the silence indicating signal indicating a period of silence is present in the digital audio signal.

5. The system of claim 4, wherein the filter module is configured to filter the digital audio signal by attenuating the magnitude of at least one of the plurality of samples.

6. The system of claim 4, wherein the filter module is configured to filter the digital audio signal by replacing at least one of the plurality of samples with a substitute sample.

7. The system of claim 6, wherein the substitute sample is pseudo-randomly chosen from a plurality of substitute samples.

8. The system of claim 4, further comprising an audio storage/playback module configured to output the filtered digital audio signal.

9. The system of claim 8, wherein the audio storage/playback module is configured to delay outputting of the filtered digital audio signal for a predetermined period.

10. The system of claim 4, wherein the filter module is configured to delay the filtering of the digital audio signal.

11. A method for processing a digital audio signal including a plurality of samples, the method comprising:
    determining a magnitude of each of the plurality of samples;
    selecting a subset of the plurality of samples;
    summing the magnitude of each of the subset of the plurality of samples to obtain a subset sum;
    comparing the subset sum to a threshold to determine whether i) the subset of the plurality of samples corresponds to a desired signal component of the digital audio signal or ii) a period of silence is present in the digital audio signal; and
    generating a silence indicating signal, wherein the silence indicating signal is indicative of whether i) the subset of the plurality of samples corresponds to a desired signal component of the digital audio signal or ii) a period of silence is present in the digital audio signal.

12. The method of claim 11, further comprising compensating for a center magnitude point of the digital audio signal when the center magnitude point differs from a zero magnitude point.

13. The method of claim 12, wherein compensating for the center magnitude point of the digital audio signal when the center magnitude point differs from the zero magnitude point is based on the equation:

$$\text{Centerpoint}(t) = \alpha * \text{sample}(t) + (1-\alpha) * \text{Centerpoint}(t-1),$$

where Centerpoint(t) is a value of the center magnitude point at time t, sample(t) is a value of the digital audio signal at time t, and a is a number between 0 and 1.

14. The method of claim 11, further comprising filtering the digital audio signal to reduce noise in response to the silence indicating signal indicating a period of silence is present in the digital audio signal.

15. The method of claim 14, wherein filtering the digital audio signal comprises attenuating the magnitude of at least one of the plurality of samples.

16. The method of claim 14, wherein filtering the digital audio signal comprises replacing at least one of the plurality of samples with a substitute sample.

17. The method of claim 16, wherein the substitute sample is pseudo-randomly chosen from a plurality of substitute samples.

18. The method of claim 14, further comprising outputting the filtered digital audio signal.

19. The method of claim 18, further comprising delaying outputting of the filtered digital audio signal for a predetermined period.

20. The method of claim 14, wherein filtering the digital audio signal comprises delaying the filtering of the digital audio signal.

* * * * *

UNITED STATES PATENT AND TRADEMARK OFFICE
CERTIFICATE OF CORRECTION

| | | |
|---|---|---|
| PATENT NO. | : 8,214,066 B1 | Page 1 of 1 |
| APPLICATION NO. | : 12/406465 | |
| DATED | : July 3, 2012 | |
| INVENTOR(S) | : Daniel Scofield et al. | |

It is certified that error appears in the above-identified patent and that said Letters Patent is hereby corrected as shown below:

ON THE TITLE PAGE:

Item (75) "Inventors:", delete "Peterson" and insert --Petersen-- therefor.

Signed and Sealed this
Eleventh Day of September, 2012

David J. Kappos
*Director of the United States Patent and Trademark Office*